United States Patent
Meiser et al.

(10) Patent No.: US 9,893,158 B2
(45) Date of Patent: Feb. 13, 2018

(54) SEMICONDUCTOR DEVICE COMPRISING A GRADUALLY INCREASING FIELD DIELECTRIC LAYER AND METHOD OF MANUFACTURING A SEMICONDUCTOR DEVICE

(71) Applicant: Infineon Technologies AG, Neubiberg (DE)

(72) Inventors: Andreas Meiser, Sauerlach (DE); Oliver Haeberlen, St. Magdalen (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/216,889

(22) Filed: Jul. 22, 2016

(65) Prior Publication Data

US 2017/0033191 A1 Feb. 2, 2017

(30) Foreign Application Priority Data

Jul. 29, 2015 (DE) ........................ 10 2015 112 427

(51) Int. Cl.
*H01L 29/40* (2006.01)
*H01L 29/66* (2006.01)
*H01L 29/78* (2006.01)
*H01L 21/3115* (2006.01)
*H01L 29/417* (2006.01)
(Continued)

(52) U.S. Cl.
CPC ...... *H01L 29/408* (2013.01); *H01L 21/31155* (2013.01); *H01L 29/0696* (2013.01); *H01L 29/401* (2013.01); *H01L 29/404* (2013.01); *H01L 29/407* (2013.01); *H01L 29/41766* (2013.01); *H01L 29/66696* (2013.01); *H01L 29/66704* (2013.01); *H01L 29/7825* (2013.01); *H01L 29/0865* (2013.01); *H01L 29/1083* (2013.01); *H01L 29/1095* (2013.01)

(58) Field of Classification Search
CPC ... H01L 29/408; H01L 29/401; H01L 29/407; H01L 29/66704; H01L 29/7825; H01L 21/31155; H01L 29/404; H01L 29/41766; H01L 29/66696; H01L 29/0696
See application file for complete search history.

(56) References Cited

U.S. PATENT DOCUMENTS

2014/0151798 A1* 6/2014 Meiser ............... H01L 29/7816
257/339

FOREIGN PATENT DOCUMENTS

| DE | 10 2004 041 198 A1 | 3/2006 |
|---|---|---|
| DE | 10 2013 113 284 A1 | 6/2014 |
| WO | 2005045938 A2 | 5/2005 |

* cited by examiner

*Primary Examiner* — Long Pham
(74) *Attorney, Agent, or Firm* — Volpe and Koenig, P.C.

(57) ABSTRACT

A semiconductor device is provided that includes a transistor in a semiconductor body having a main surface. The transistor includes a source region, a drain region, a body region, a drift zone, and a gate electrode at the body region. The body region and the drift zone are disposed along a first direction between the source region and the drain region. The first direction is parallel to the main surface. The semiconductor device further includes a field plate disposed in field plate trenches extending along the first direction in the drift zone, and a field dielectric layer between the field plate and the drift zone. A thickness of the field dielectric layer gradually increases along the first direction from a portion adjacent to the source region to a portion adjacent to the drain region.

10 Claims, 14 Drawing Sheets

(51) Int. Cl.
 H01L 29/06 (2006.01)
 *H01L 29/10* (2006.01)
 *H01L 29/08* (2006.01)

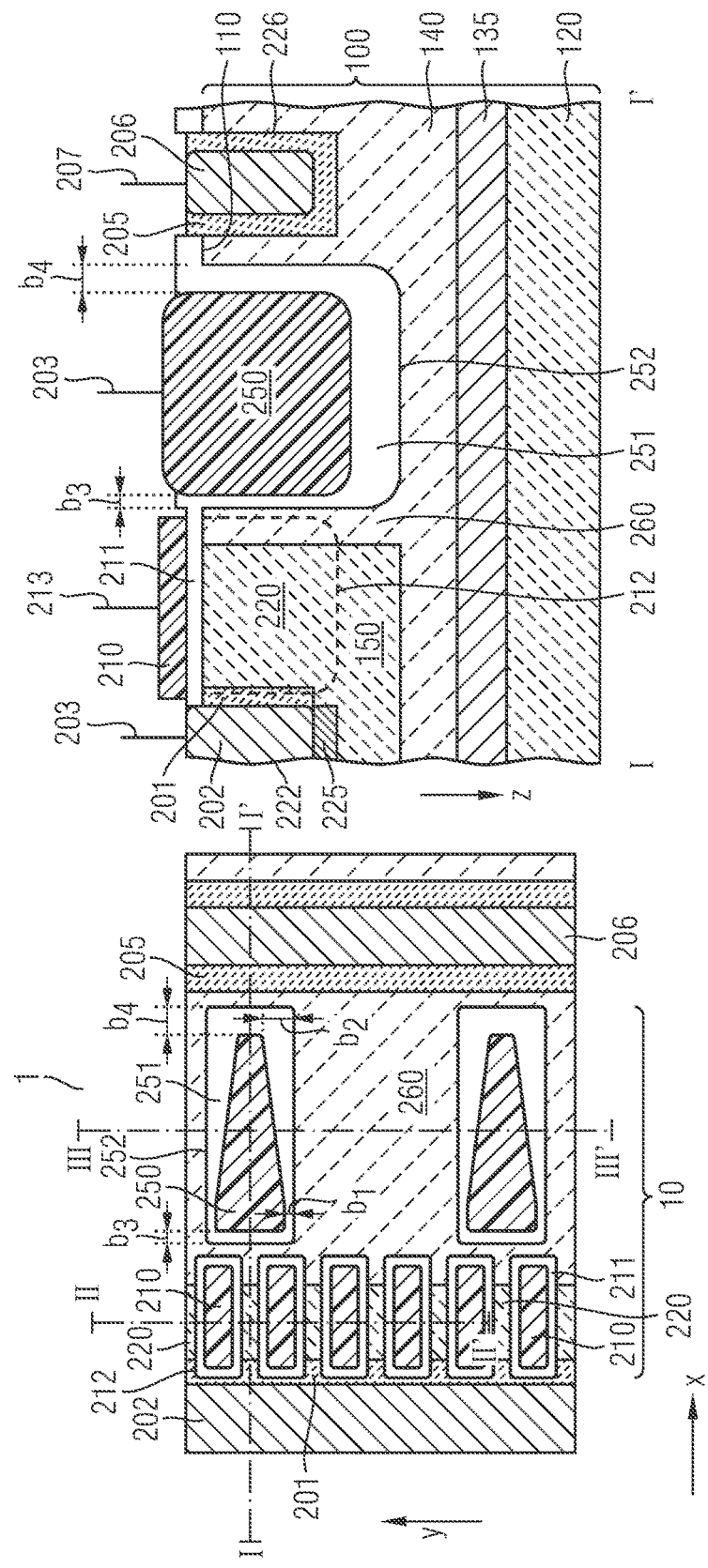

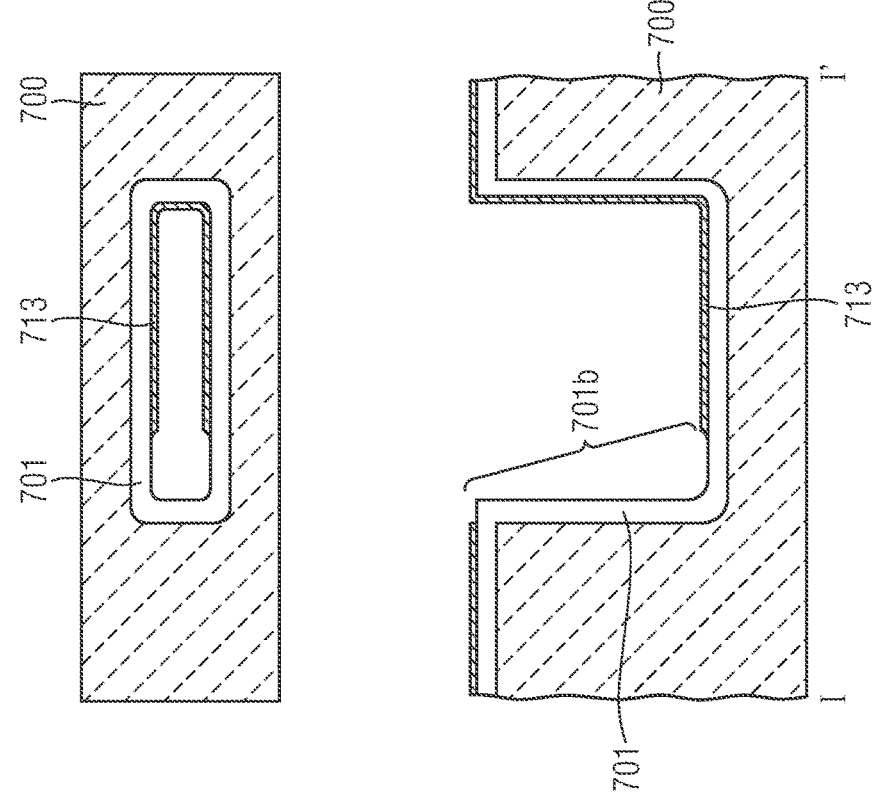

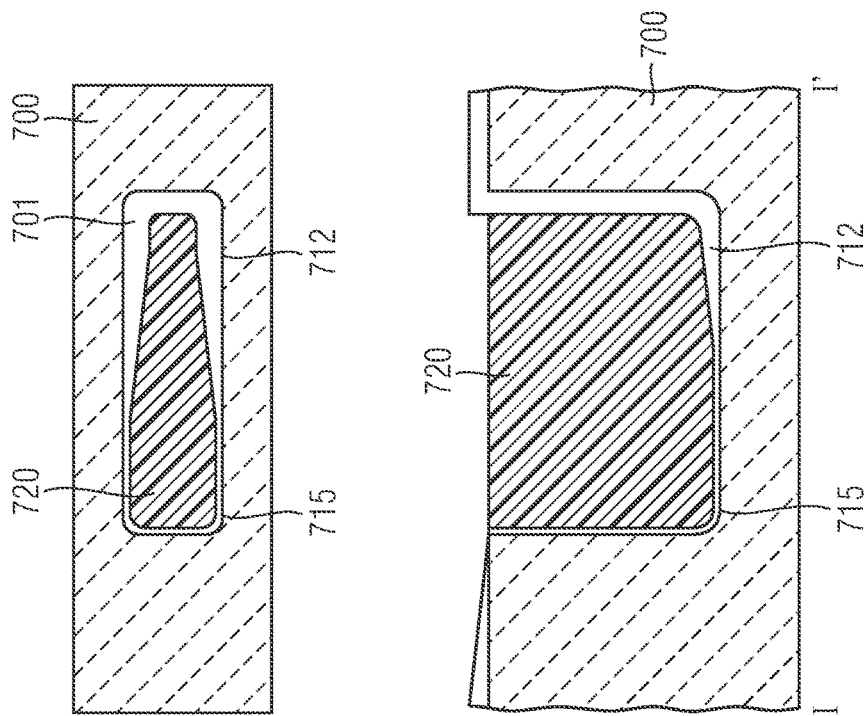
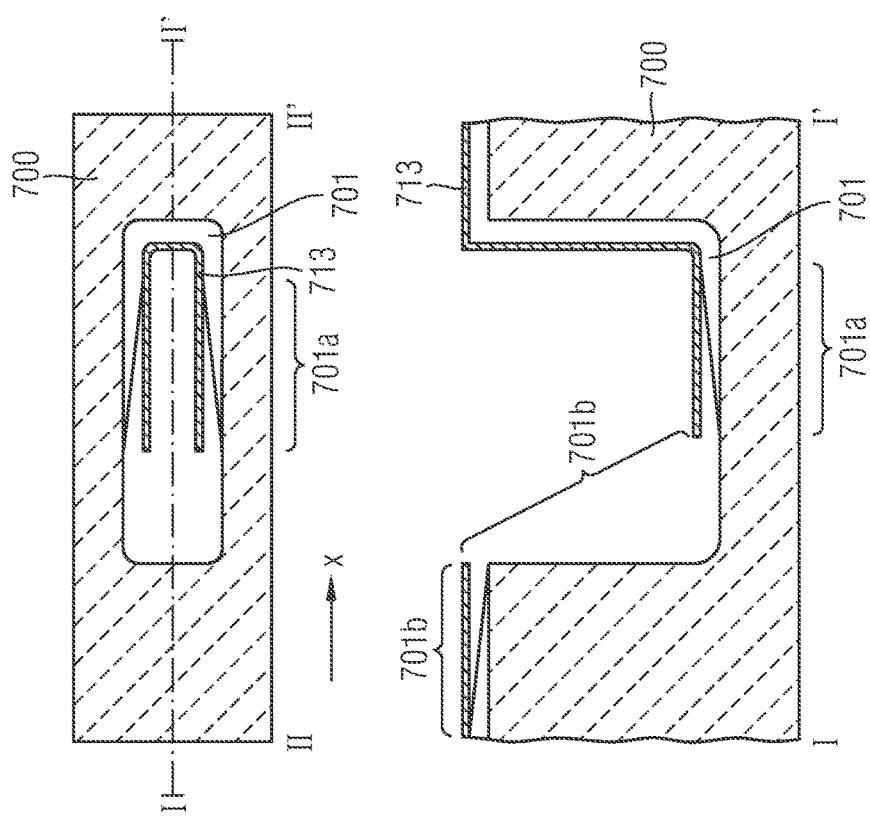

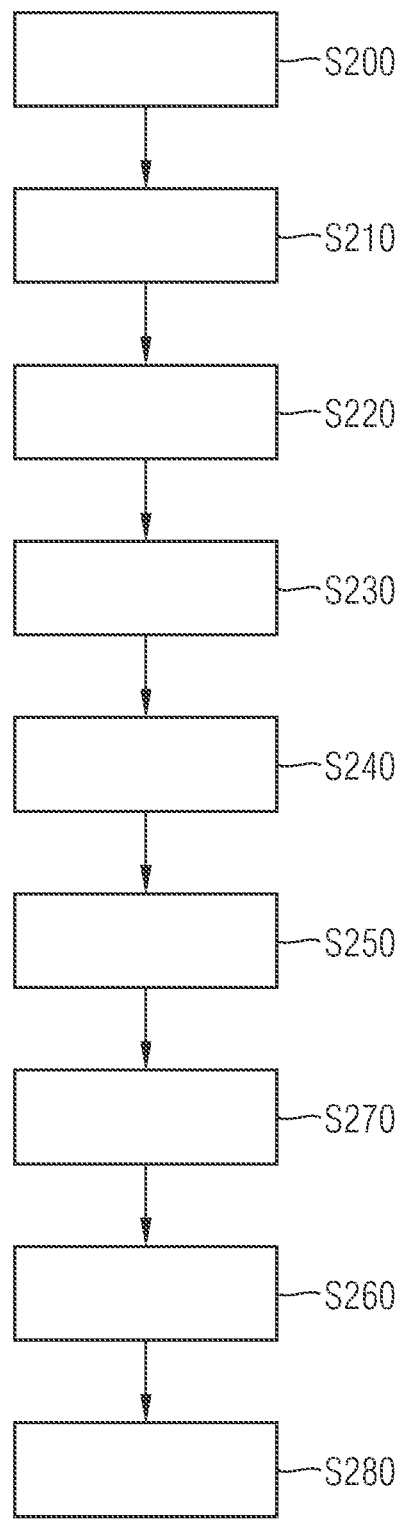

SEMICONDUCTOR DEVICE COMPRISING A GRADUALLY INCREASING FIELD DIELECTRIC LAYER AND METHOD OF MANUFACTURING A SEMICONDUCTOR DEVICE

FIELD

The present disclosure relates generally to a semiconductor device and to methods for manufacturing the same, and, more particularly, to a transistor in a semiconductor body of the semiconductor device.

BACKGROUND

Power transistors commonly employed in automotive and industrial electronics require a low on-state resistance ($R_{on}$), while securing a high voltage blocking capability. For example, a metal oxide semiconductor (MOS) power transistor should be capable, depending upon application requirements, to block drain to source voltages $V_{ds}$ of some tens to some hundreds or thousands of volts. MOS power transistors typically conduct very large currents which may be up to some hundreds of amperes at typical gate-source voltages of about 2 to 20 V.

Lateral power devices, in which current flow mainly takes place parallel to a main surface of a semiconductor substrate, are useful for semiconductor devices in which further components, such as switches, bridges and control circuits are integrated.

SUMMARY

According to an embodiment, a semiconductor device comprises a transistor in a semiconductor body having a main surface. The transistor comprises a source region, a drain region, a body region, a drift zone, and a gate electrode at the body region. The body region and the drift zone are disposed along a first direction between the source region and the drain region, the first direction being parallel to the main surface. The transistor further comprises a field plate disposed in field plate trenches extending along the first direction in the drift zone, and a field dielectric layer between the field plate and the drift zone. A thickness of the field dielectric layer gradually increases along the first direction from a portion adjacent to the source region to a portion adjacent to the drain region.

According to an embodiment, a method of manufacturing a semiconductor device comprises forming a trench in a semiconductor substrate, forming an oxide layer over sidewalls and over a bottom side of the trench, performing an ion implantation process, forming a cover layer and patterning the covering layer, thereby forming an uncovered area and a covered area of the oxide layer, respectively. The method further comprises performing an isotropic etching process thereby removing portions of the uncovered area of the oxide layer and removing a part of a surface portion of the covered area adjacent to the uncovered portions, and removing remaining portions of the covering layer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of this specification. The drawings illustrate the main embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

FIG. 1A shows a horizontal cross-sectional view of a semiconductor device according to an embodiment;

FIG. 1B shows a vertical cross-sectional view of the semiconductor device of FIG. 1A along line I-I' in a first direction;

FIG. 8A shows portions of a semiconductor substrate, including a horizontal cross-sectional (top) and vertical cross-sectional (bottom), when performing the method according to an embodiment;

FIG. 8B shows portions of a semiconductor substrate, including a horizontal cross-sectional (top) and vertical cross-sectional (bottom), when performing the method according to an embodiment;

FIG. 8C shows portions of a semiconductor substrate, including a horizontal cross-sectional (top) and vertical cross-sectional (bottom), when performing the method according to an embodiment;

FIG. 8D shows portions of a semiconductor substrate, including a horizontal cross-sectional (top) and vertical cross-sectional (bottom), when performing the method according to an embodiment;

FIG. 10 shows a flow diagram a method of manufacturing a semiconductor device according to a further embodiment.

DETAILED DESCRIPTION

Figure 1C:
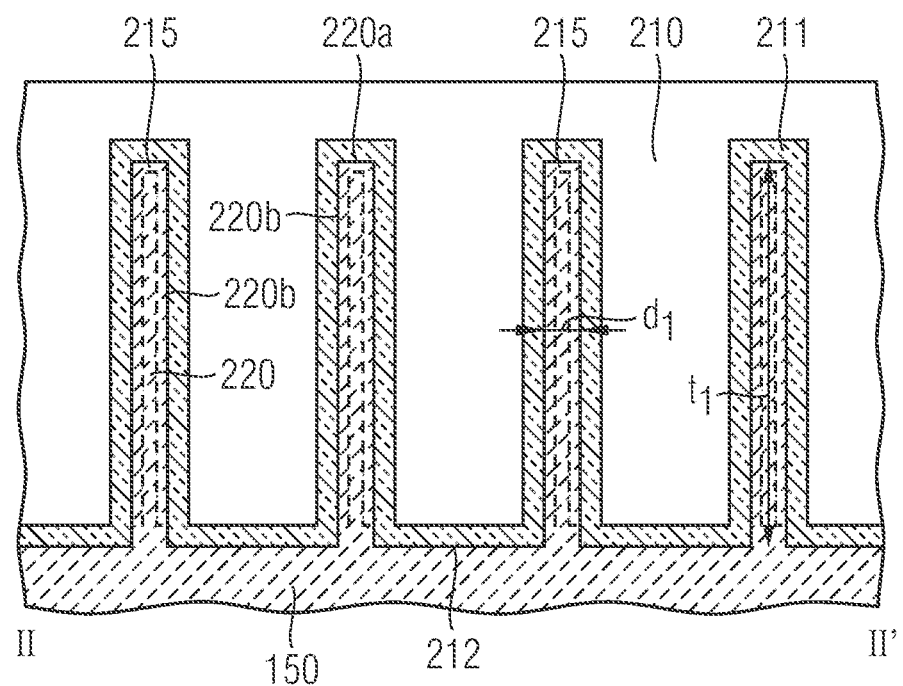
FIG. 1C shows a cross-sectional view of the semiconductor device of FIG. 1A along line II-II' in a second direction.

In the following detailed description reference is made to the accompanying drawings, which form a part hereof and in which are illustrated by way of illustration example embodiments. In this regard, directional terminology such as "top", "bottom", "front", "back", "leading", "trailing" etc. is used with reference to the orientation of the Figures being described. Since components of the embodiments can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1A shows a horizontal cross-sectional view of a semiconductor device 1 taken in a plane parallel to a main surface of a semiconductor substrate. The semiconductor device 1 includes a transistor 10. The transistor 10 shown in FIG. 1A comprises a source region 201, a drain region 205, a body region 220, and a drift zone 260. The source region 201, the drain region 205 and the drift zone 260 may be doped with dopants of a first conductivity type, for example n-type dopants. The doping concentration of the source and the drain regions 201, 205 may be higher than the doping concentration of the drift zone 260. The body region 220 is arranged between the source region 201 and the drift zone 260. The body region 220 is doped with dopants of a second conductivity type, for example with p-type dopants. The drift zone 260 may be arranged between the body region 220 and the drain region 205. The body region 220 and the drift zone 260 are disposed along a first direction (e.g. the x-direction) between the source region 201 and the drain region. In particular, the source region 201, the body region 220, the drift zone 260 and the drain region 205 may be arranged along the first direction. According to the embodiment shown in FIG. 1A the first direction is parallel to the main surface 110.

The semiconductor device may further comprise a source contact 202 adjacent to the source region 201. For example, a metal, e.g. tungsten may form the source contact 202. The source contact 202 is electrically connected to the source region 201. The drain region 205 is electrically connected to a drain contact 206 adjacent to the drain region 205. For example, a metal may form the drain contact 206. The semiconductor device 1 further comprises a gate electrode 210. The gate electrode 210 is insulated from the body region 220 by means of a gate dielectric 211 such as silicon oxide. The semiconductor device 1 further comprises a field plate and a field dielectric layer 251 between the field plate 250 and the drift zone 260. The field plate 250 is disposed in a field plate trench 252 formed in the drift zone 260 and extending in the first direction.

A thickness of the field dielectric layer 251 gradually increases along the first direction from a portion adjacent to the source region 201 to a portion adjacent to the drain region 205. The term "gradually increases" means that the thickness of the field dielectric layer has a plurality of intermediate values between a first thickness b1 and a second thickness b2 of the field dielectric layer 251. The thickness b1 and b2 may be measured along the second direction, e.g. the Y-direction. For example, the thickness of the field dielectric layer 251 may be measured at a side of the field plate close to the source region 201 and the second thickness b2 may be measured at a position close to the drain region 205. In this case there is not one abrupt step at which the thickness increases from b1 to b2 but there are a plurality of intermediate values of the thickness. According to a further explanation, the field dielectric layer 251 may be a tapered layer. The layer thickness may monotonically increase. Differently stated, along the first direction, starting from a side adjacent to the source region, the field dielectric layer 251 does not have any portions with decreasing thickness.

For example, the thickness of the field dielectric layer 251 may increase in a linear manner or a quasi-linear manner. In more detail, an increase in thickness may be small in comparison to the distance between two adjacent points at which the thickness is measured. The thickness of the field dielectric layer 251 may increase in a linear or in a non-linear manner. Further, the thickness of the field dielectric layer 251 may increase in a linear manner in a first section of the field dielectric layer 251. In a second section of the field dielectric layer 251, the thickness may increase in a non-linear manner. According to a further implementation, the layer thickness may increase in a stepwise manner from b1 to b2. For example, a ratio of the second thickness b2, measured at the side of the drain region, to the first thickness b1, measured at the side of the source region may be larger than 2, e.g. more than 2 and less than 100.

Further, a third thickness b3 measured along the first direction (e.g. the X-direction) between the field plate 250 and the drift zone 260 may be smaller than a fourth thickness b4 of the thickness which is measured between the field plate 250 and the drain region 205 along the first direction. For example, a ratio of the fourth thickness b4 to the third thickness b3 may be larger than 2, e.g. more than 2 and less than 100.

According to the embodiments described, up to a depth of approximately 60 or 70% of the depth of the field plate trench 252, any of the thickness of the field dielectric layer 251 measured along the second direction or measured along the first direction may not vary or vary to only a small amount along the depth direction of the substrate 100. For example, a maximum variation of the thickness of the field dielectric layer 251 measured along the first direction or the thickness of the field dielectric layer 251 measured along the second direction may be less than 5%. According to a further modification, any of these thicknesses may increase along the depth direction.

The transistor 10 may implement a lateral transistor. Accordingly, a current flow from the source region 201 to the drain region 205 may be mainly accomplished in the first direction.

When a suitable voltage is applied to the gate electrode 210, a conductive inversion layer 215 is formed at the boundary between the body region 220 and the insulating gate dielectric layer 211. Accordingly, the transistor is in a conducting state from the source region 201 to the drain region 205 via the drift zone 260. The conductivity of the channel (conductive inversion layer 215) that is formed in the body region 220 is controlled by the gate electrode. By controlling the conductivity of the channel 215 formed in the body region 220, the current flow from the source region 201 via the channel 215 (shown in FIG. 1C) formed in the body region 220 and the drift zone 260 to the drain region 205 may be controlled.

When the transistor is switched off, no conductive channel 215 is formed at the boundary between the body region 220 and the insulating gate dielectric layer 211 so that a sub-threshold current flows.

According to an embodiment, the transistor may be implemented as a normally-off transistor. According to a further embodiment, the transistor may be implemented as a normally-on transistor. In this case, the body region 220 may be doped with dopants of the first conductivity type, for example, with n-type dopants.

An appropriate voltage may be applied to the field plate in an off-state. For example, the field plate 250 may be electrically connected to a source terminal 203, which is also electrically connected to the source region 201 via the source contact 202. In an off-state, the field plate 250 depletes charge carriers from the drift zone 260 so that the breakdown voltage characteristics of the transistor 200 are improved. In a transistor 200 comprising the field plate 250, the doping concentration of the drift zone 260 may be increased without deteriorating the breakdown voltage characteristics in comparison to a device without a field plate. Due to the higher doping concentration of the drift zone, the on-resistance $RDS_{on} \cdot A$ is further decreased resulting in improved device characteristics.

Throughout the present specification elements of transistor cells of the field effect transistor are described. Generally, the field effect transistor comprises a plurality of transistor cells that are connected in parallel. For example, each single transistor cell comprises a single gate electrode, a body region and further components. The gate electrodes of the single transistor cells may be connected to a common terminal, e.g. the gate terminal 213. Further components of the single transistor cells, e.g. the source regions 201, the drain regions 205 may be respectively connected to a common source terminal, a common drain terminal, etc. The present specification mainly describes the function and structure of the single transistor cells. As is to be readily understood, this description may likewise apply to the further single transistor cells.

FIG. 1B shows a vertical cross-sectional view of the semiconductor device shown in FIG. 1A. The cross-sectional view of FIG. 1B is taken between I and I'.

The semiconductor substrate 100 may comprise a base layer 120 of the second conductivity type, an intermediate layer 135 of the first conductivity type and an epitaxially grown second layer 140 of the first conductivity type. The second layer 140 may be doped at a lower doping concentration than the intermediate layer 135. A well portion 150 is disposed in a portion of the second layer 140. The source contact 202 may be disposed in a source contact trench 222 that is formed in the main surface 110 of the semiconductor substrate 100. The source region 201 may be disposed adjacent to the source contact trench 222 and may vertically extend into the depth direction. The source contact 202 is electrically connected to a source terminal 203.

A portion of the gate electrode 210 may be disposed over the main surface 110 of the semiconductor substrate 100 and may horizontally extend over the body region 220. Further, the gate electrode 210 may be disposed in trenches 212 that are formed in the main surface 110 and which extend into the first direction, e.g. the X-direction, parallel to the main surface 110. The gate trenches 212 are indicated by broken lines in FIG. 1B. The gate electrode 210 is electrically connected to a gate terminal 213.

Further, the field plate 250 may be disposed in field plate trenches 252 that are formed in the main surface 110 of the semiconductor substrate and which extend in the x-direction. The drain contact 206 may be disposed in a drain contact trench 226 that extends from the main surface 110 into a vertical direction. The drain region 205 may be formed so as to be adjacent to the drain contact trench 226. In particular, also the drain region 205 may extend into a depth direction. The drain contact 206 is electrically connected to a drain terminal 207. The field plate 250 may be electrically connected to the source terminal 203. Alternatively, the field plate 250 may be electrically connected to a different terminal, e.g. to the gate terminal 213. The semiconductor device of FIG. 1B further comprises a body contact portion 225 of the second conductivity type that is electrically connected to the body region 220 and to the source contact portion 202. The body contact portion 225 further suppresses or deteriorates a parasitic bipolar transistor that could otherwise form in this region. The body contact portion 225 may be doped with dopants of the second conductivity type at a higher concentration than the body region 220.

FIG. 1C illustrates a cross-sectional view of the semiconductor device which is taken between II and II as is also illustrated in FIG. 1A. The direction between II and II' is perpendicular to the first direction and parallel to the second direction, e.g. the Y-direction. As is shown in FIG. 1C, the body region 220 may be patterned by adjacent gate trenches 212 into the shape of a ridge, the ridge having a width d1. For example, the ridge may have a top side 220a, a first and a second sidewall 220b. The sidewalls 220b may extend perpendicularly or at an angle of more than 75° with respect to the main surface 110.

According to an embodiment, the width of the body region 220 fulfills the following relationship: d1≤2·ld, wherein ld denotes a length of a depletion zone which is formed at the interface between the gate dielectric layer 211 and the body region 220. For example, the width of the depletion zone may be determined as:

$$ld = \sqrt{\frac{4\varepsilon_s kT \ln(N_A/n_i)}{q^2 N_A}}$$

wherein $\varepsilon_S$ denotes the permittivity of the semiconductor material ($11.9 * \varepsilon_0$ for silicon), k denotes the Boltzmann constant ($1.38066*10^{-23}$ J/K), T denotes the temperature, e.g. 293K, ln denotes the natural logarithm, $N_A$ denotes the impurity concentration of the semiconductor body, $n_i$ denotes the intrinsic carrier concentration ($1.45*10^{10}$ for silicon at 27° C.), q denotes the elementary charge ($1.6*10^{-19}$ C).

Generally, the length of the depletion zone varies depending from the gate voltage. In a transistor, the length of the depletion zone at a gate voltage corresponding to the threshold voltage corresponds to the maximum width of the depletion zone. For example, a distance between gate trenches 212 may be approximately 10 to 200 nm, for example 20 to 60 nm along the main surface 110 of the semiconductor substrate 100. According to the embodiment, in which the width d1≤2·ld, the transistor 10 is a so-called "fully depleted" transistor in which the body region 220 is fully depleted when the gate electrode 210 is set to an on-voltage. In such a transistor, an optimal sub-threshold voltage may be achieved and short channel effects may be efficiently suppressed, resulting in improved device characteristics.

Figure 1D:
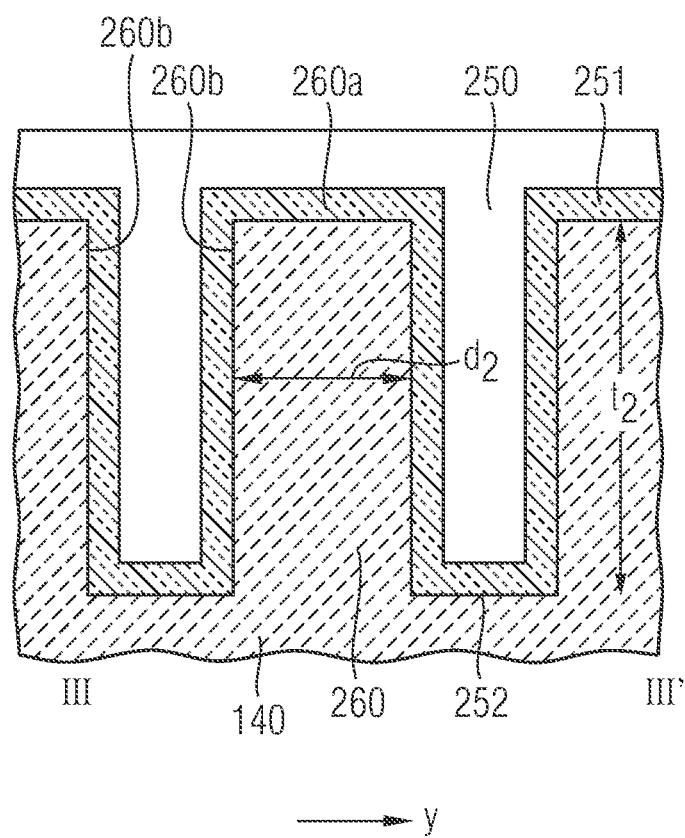
FIG. 1D shows a cross-sectional view of the semiconductor device of FIG. 1A along line III-III' in a second direction.

FIG. 1D shows a cross-sectional view of the semiconductor device between III and III' as is also shown in FIG. 1A. In particular, the cross-sectional view of FIG. 1D is taken along the second direction, e.g. the Y-direction and intersects a plurality of field plate trenches 252. The drift zone 260 may be patterned by adjacent field plate trenches 252 into the shape of a second ridge. A width d2 of the second ridge may be larger than a width of the first ridge of the body region 220. In other words, a distance between adjacent field plate trenches 252 may be larger than a distance between adjacent gate trenches 212 as shown in FIG. 1C. As a result, a number of field plate trenches 252 may be smaller than a number of gate trenches 212. A portion of the field plate 250 may be disposed over the main surface 110 of the semiconductor substrate and may horizontally extend over the drift zone 260.

The embodiment of FIGS. 1A to 1D relates to a semiconductor device 1 comprising a transistor 10 in a semiconductor body 100 having a first main surface 110. The transistor 10 comprises a source region 201, a drain region 205, a body region 220, a drift zone 260 and a gate electrode 210 at the body region 220. The body region 220 and the drift zone 260 are disposed along a first direction between the source region 201 and the drain region 205. The gate electrode 210 is disposed in trenches extending in the first direction. The semiconductor device further comprises a plurality of field plates 250 disposed in field plate trenches 252 extending along the first direction in the drift zone 260. Moreover, the semiconductor device comprises a field dielectric layer between the field plate and the drift zone. A thickness of the field dielectric layer 251 gradually increases along the first direction from a portion adjacent to the source region to a portion adjacent to the drain region 205.

Due to the feature of the gradually increasing thickness of the field dielectric layer 251 in a direction from a side at the source region to a side at the drain region, the drift zone 260 may be depleted in a more homogenous manner when the transistor is in an off-state. In more detail, the electrical field in the drift zone decreases from drain region to source region. When the thickness of the field dielectric layer decreases from drain region to source region, the electrical field in the drift zone may be adapted and may be made more homogenous. As a consequence, the depletion characteristics of the drift zone 260 may be improved, avalanche breakdown may be avoided, and, finally, the doping concentration of the drift zone 260 may be increased. As a result, the $RDS_{on}$·A characteristics of the transistor are improved.

According to an embodiment, the gate electrode 210 is disposed in trenches extending in the first direction. According to an embodiment, the first direction is parallel to the first main surface 110

According to the embodiment illustrated in FIGS. 1A to 1D, the field plate trenches 252 and the gate trenches 212 may be separated from each other, respectively. Accordingly, the trenches are not merged and the conductive material within the two trenches may be electrically connected to different terminals.

Figure 2A:
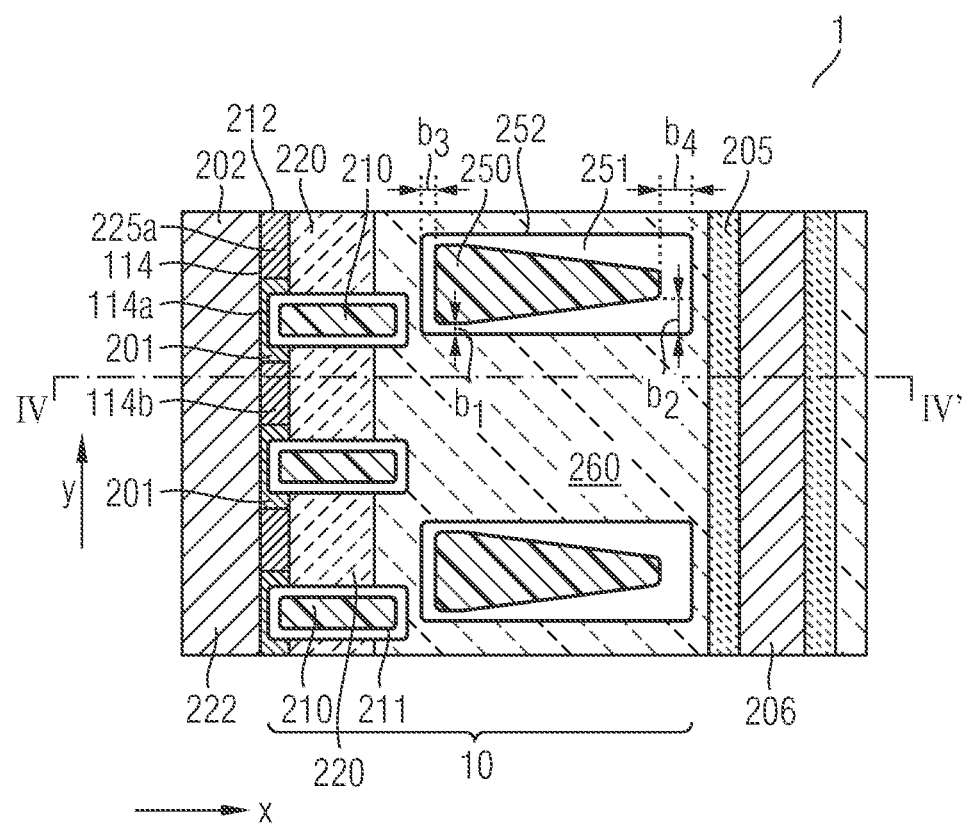
FIG. 2A shows a horizontal cross-sectional view of a semiconductor device according to a further embodiment.

FIG. 2A shows a horizontal cross-sectional view of a semiconductor device 1 according to a further embodiment. Differing form the embodiment described with reference to FIGS. 1A to 1D, the transistor comprises a vertical body contact portion 225a that may be disposed at the main surface. The vertical body contact portion 225 is electrically connected to the source contact 202 and to the body region 220. As will be discussed with reference to FIG. 2B, the body contact portion 225 vertically overlaps with the source region 201. Within the context of the present specification, the wording "vertically overlaps with" is intended to mean that the respective portions or regions may extend in the same depth. In more detail, there may be a vertical extension of the semiconductor body at which the respective portions or regions may be present. To be more specific, the starting points of the respective portions or regions do not need to coincide. Further, the end points of the respective portions or regions do not need to coincide.

As is illustrated in FIG. 2A, the source contact 202 is disposed in a source contact trench 222 extending along the second direction, e.g. the Y-direction. According to the embodiment of FIG. 2A, sections of a semiconductor material adjacent to a first sidewall portion 114a of the source contact trench 222 are doped with the first conductivity type. Sections of the semiconductor material adjacent to a second sidewall portion 114b of the source contact trench are doped with the second conductivity type so as to define the vertical body contact portions 225a. For example, this may be accomplished by masking the different sections of the sidewall 114 when performing the respective doping processes. The gate trenches 212 and, consequently, the gate electrodes 210 are disposed so as to be adjacent to the source region 201, whereas the vertical body contact portion 225a is disposed at a position between adjacent gate trenches 212.

Figure 2B:
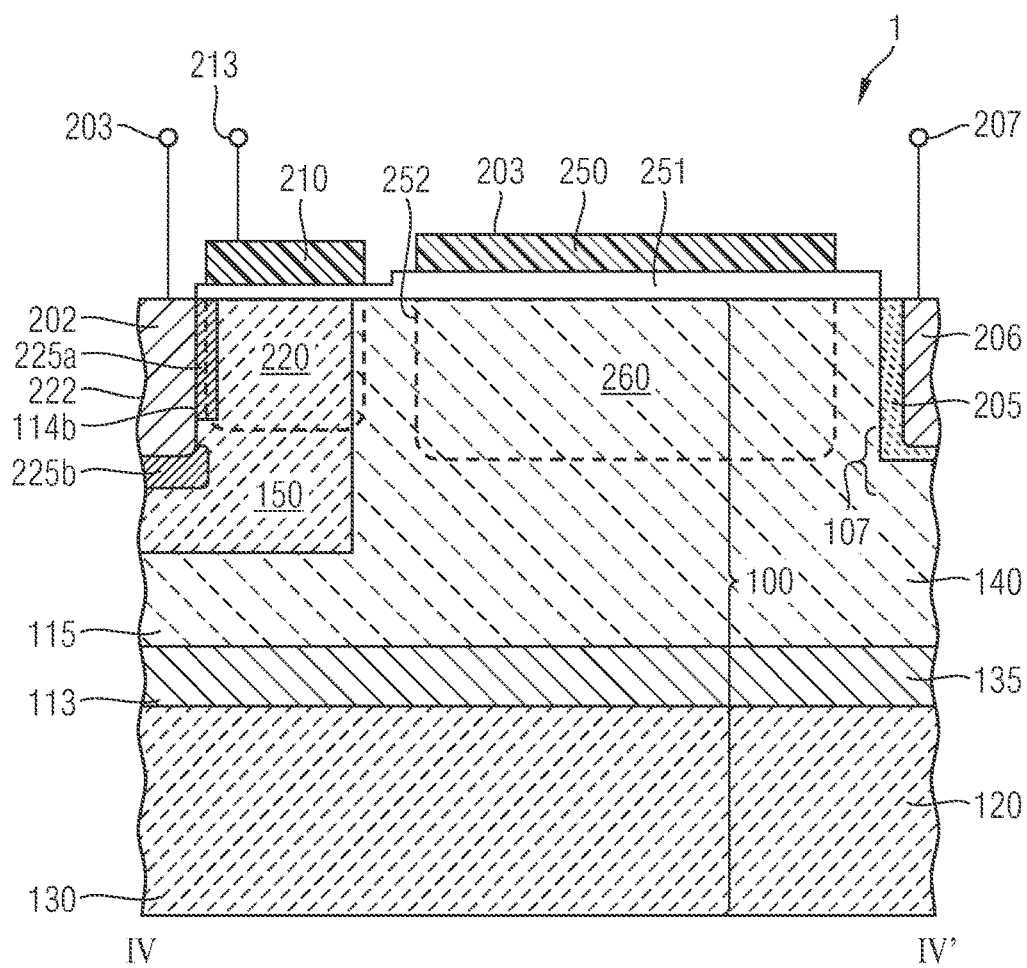
FIG. 2B shows a vertical cross-sectional view of the semiconductor device shown in FIG. 2A along line IV-IV'.

FIG. 2B shows a cross-sectional view that is taken between IV and IV', as is also illustrated in FIG. 2A. The cross-sectional view is taken so as to be disposed between adjacent gate trenches 212. The position of the gate trenches 212 is before and behind the depicted plane of the drawing and indicated by broken lines. The vertical body contact portion 225a is disposed between the source contact 202 and the body region 220 along the first direction. According to embodiments, as is specifically illustrated in FIG. 2B, the transistor 10 may further comprise a horizontal body contact portion 225b that may be disposed below a bottom side of the source contact trench 222. The further components are similar to those illustrated in FIGS. 1A to 1D.

As has been illustrated with reference to FIGS. 2A and 2B, the transistor comprises a vertical body contact portion 225a that may be disposed at a sidewall of a source contact trench 222. For example, the vertical body contact portion 225a may extend to at least the depth of the source contact trench 222. According to further embodiments, the vertical body contact portion 225a may extend to at least half the depth of the source contact trench 222. For example, the vertical body contact portion 225a may extend from the main surface 110. Due to the presence of the vertical body contact portion 225a, a parasitic bipolar transistor may be deteriorated or suppressed in an improved manner. To be more specific, holes may be more effectively prevented from flowing across the body region 220.

According to the embodiment shown in FIGS. 2A and 2B, the conductive channel regions 215 formed at opposing sidewalls 220b of a ridge may not merge with each other so that the body region 220 may not be fully depleted and may be connected to the source region and to the body contact region 225. According to all embodiments described herein, due to the feature that the body contact portion 225 vertically overlaps with the source region 201, and additionally the feature that the body contact portion 225 is electrically connected to the source contact, the suppression of the parasitic bipolar transistor may be improved. In more detail, holes may be efficiently removed from the body region, thereby preventing detrimental effects such as a snap-back effect. This results in an improved safe-operating area (SOA) that corresponds to a region in the I-V-characteristic in which the semiconductor device may be safely operated. The specific implementation of the vertical body contact portion 225a may be applied to all embodiments described herein.

Figure 3:
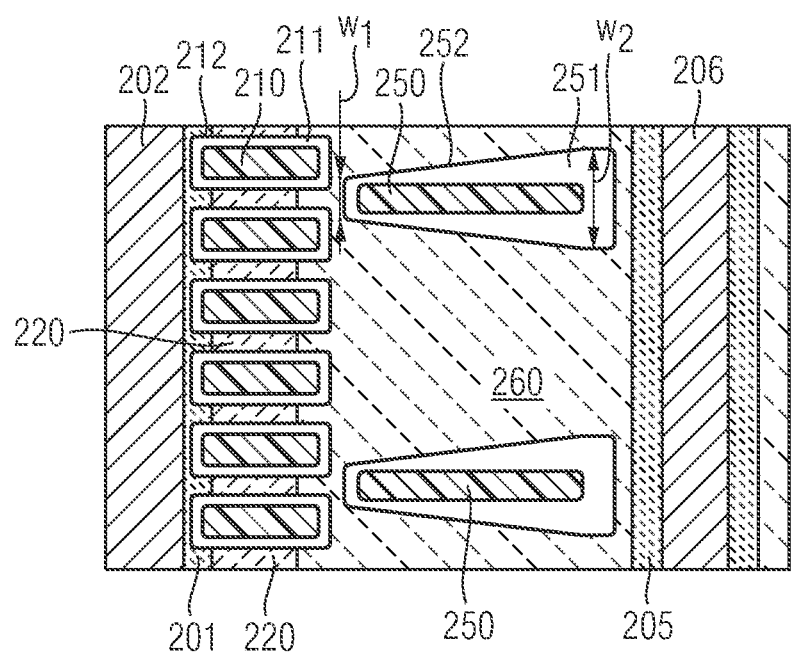
FIG. 3 shows a horizontal cross-sectional view of a semiconductor device according to a further embodiment.

FIG. 3 shows a horizontal cross-sectional view of a semiconductor device according to a further embodiment. In FIG. 3, the same components are denoted by the same reference numerals as in FIG. 1A. In FIG. 3 the gate electrode is disposed in gate trenches 212. According to the embodiment, the gate trenches 212 are separate from the field plate trenches 252. Differing from the embodiment shown in FIG. 1A, the width of the field plate trenches 252 gradually increases along the first direction from a side adjacent to the source region 201 to a side adjacent to the drain region 205. In more detail, the width $w_1$ of the field plate trench 252 is increased to the width $w_2$ which is close to the drain region 205. The widths $w_1$ and $w_2$ may be measured along the second direction, e.g. the Y-direction. As a result, a width of the drift zone 260 between adjacent field plate trenches 252 decreases from a side adjacent to the source region 201 to a side adjacent to the drain region 205. Thereby, the above-mentioned effect of the decrease of the electrical field in the drift zone from drain region to source region may be enhanced. When the thickness of the field dielectric layer decreases from drain region to source region, the electrical field in the drift zone may be adapted and may be made more homogenous. As a consequence, the depletion characteristics of the drift zone 260 may be improved, avalanche breakdown may be avoided, and, finally, the doping concentration of the drift zone 260 may be increased. As a result, the $RDS_{on}$·A characteristics of the transistor are improved.

A vertical cross-sectional view of the semiconductor device show in FIG. 3 may be similar or identical with the cross-sectional view shown in FIG. 1B.

Figure 4:
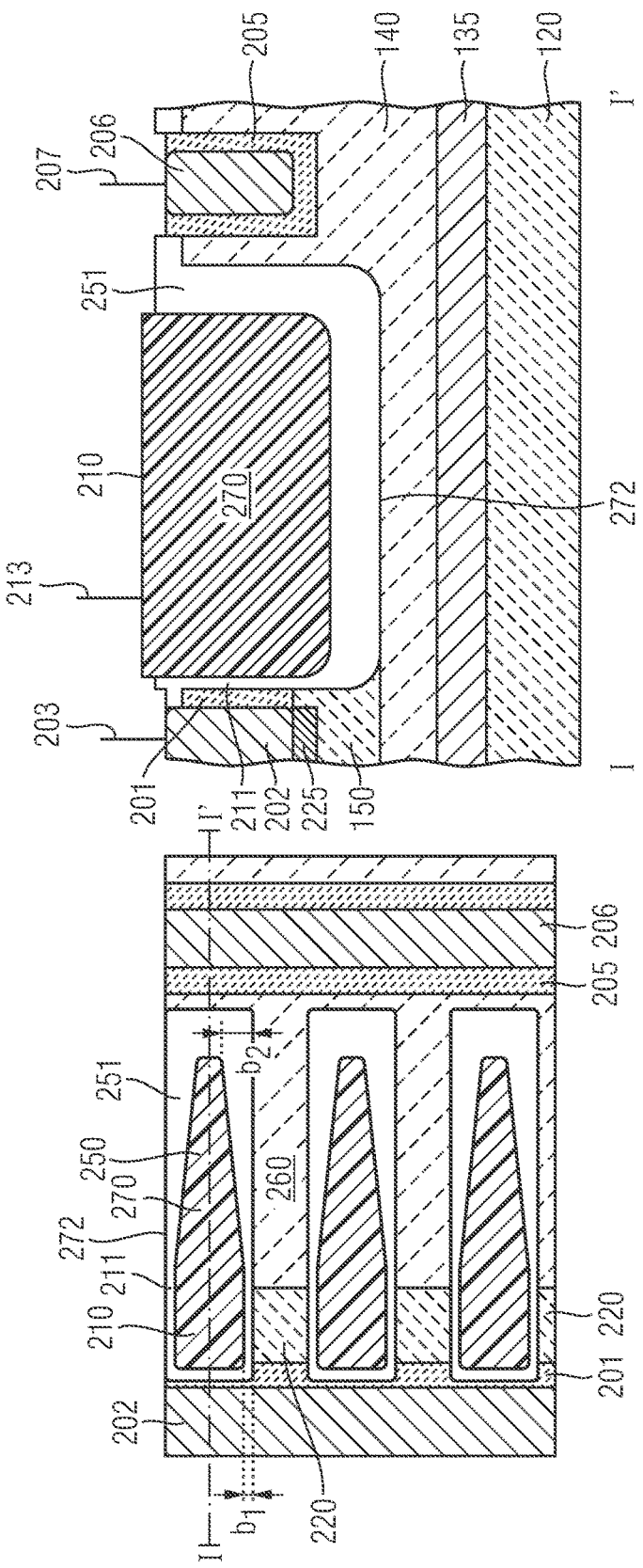
FIG. 4A shows a horizontal cross-sectional view of a semiconductor device according to a further embodiment.
FIG. 4B shows a vertical cross-sectional view of the semiconductor device of FIG. 4A along line I-I'.

FIG. 4A shows a horizontal cross-sectional view of a semiconductor device according to a further embodiment. According to the embodiment of FIG. 4A, the field plate trenches are merged with the gate trenches. In particular, the gate electrode 250 and the field plate 250 are disposed in a single trench 272 that may extend from the body region 220 to the drift zone 260. The further components of FIG. 4A may be similar or identical with the respective components of FIG. 1A. As is shown, the thickness of the gate dielectric layer 211 may be constant in a region adjacent to the body region 220. However, a thickness of the field dielectric layer 251 may gradually increase in a portion adjacent to the drift zone 260. For example, the thickness of the field dielectric layer 251 may increase from a first thickness b1 to a second thickness b2. Further, a thickness of the field dielectric layer measured along the first direction at a side close to the drain region 205 may be larger than a thickness of the gate dielectric layer 211 measured along the first direction. FIG. 4B shows a vertical cross-sectional view which is taken between I and I', as is also illustrated in FIG. 4A. As is shown, a single electrode 270 is arranged in a trench 272 that extends from the body region 220 to the drift zone 260. The electrode 270 may be electrically connected to the gate terminal 213. In a portion adjacent to the body region, the electrode 270 acts as a gate electrode, the gate electrode being insulated from the adjacent body region 220 by means of the thin gate dielectric layer 211. In a portion adjacent to the drift zone 260, the electrode 270 acts as a field plate. Further, a thickness of the field dielectric layer 252 in this portion is larger than a thickness of the gate dielectric layer 211. The further components of this embodiment are similar or identical with the respective components shown herein before.

When the transistor is switched on by applying a suitable voltage to the electrode 270, a conductive inversion layer 215 is formed at the boundary between the body region 220 and the insulating gate dielectric layer 211. At the same time, charge carriers are accumulated in the drift zone 260 at the boundary between the drift zone 260 between the drift zone 260 and the field dielectric layer 251. Thereby, the conductivity of the drift zone may be further improved resulting in an decreased $Rds_{on} \cdot A$.

The semiconductor device may be further modified, e.g. by disposing gate trenches which only include a gate electrode 250 between adjacent trenches 272. For example, a gate trench 252 may be disposed between the trenches 272 or may be disposed at a larger distance. According to a further embodiment, the gate electrode 210 and the field plate 250 may be arranged in the trench 272, the gate electrode 210 and the field plate 250 being insulated from each other.

Figure 5:
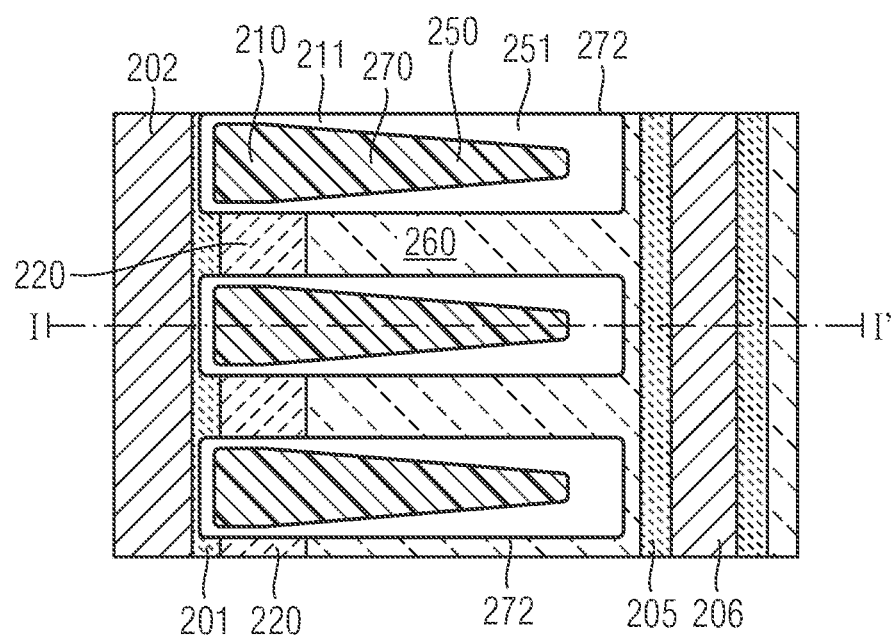
FIG. 5 shows a horizontal cross-sectional view of a semiconductor device according to a further embodiment.

FIG. 5 shows a further modification of the embodiment of FIGS. 4A and 4B. Differing from the embodiment shown in FIGS. 4A and 4B, the thickness of the gate dielectric layer 211 increases in a portion adjacent to the body region 220. In particular, the thickness of the gate dielectric layer 211 may gradually increase from a side adjacent to the source region to a side adjacent to the drain region. The further components of the embodiments of FIG. 5 may be similar or identical with the respective components of the Figures shown before. Moreover, the vertical cross-sectional view taken along the first direction between I and I' may be identical with the cross-sectional view shown in FIG. 4B.

Figure 6:
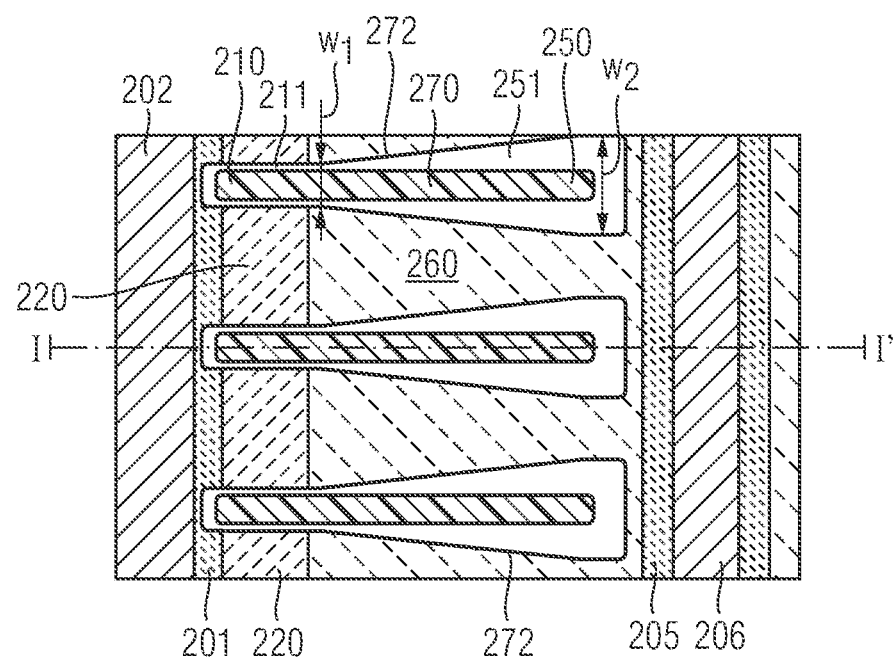
FIG. 6 shows a horizontal cross-sectional view of a semiconductor device according to a further embodiment.

FIG. 6 shows a horizontal cross-sectional view of a semiconductor device according to a further embodiment. The embodiment of FIG. 6 is based on the embodiment shown in FIGS. 4A and 4B. Further, the trench 272 may be formed so as to have a varying width, the width being measured along the second direction. For example, the gate electrode 210 and the field plate 250 may be disposed in the trench 272. Throughout the body region 220, the trench 272 may have a constant width $w_1$. The width $w_1$ increases from the portion adjacent to the body region 220 to the portion adjacent to the drain region 205. According to the embodiment shown in FIG. 6, a width of the field plate 250 does not substantially vary. Moreover, a thickness of the field dielectric layer 251 increases from a side adjacent to the body region 220 to a side adjacent to the drain region 205. According to further embodiments, a width of the field plate 250 may also vary. Further, the embodiment of FIG. 6 may be modified in various manners. For example, gate trenches 212 which only extend in the body region 220 may be disposed between adjacent trenches 272. Due to the increasing width of the trenches 272, a width of the drift zone decreases from a side adjacent to the body region 220 to a side adjacent to the drain region 205. The further components of the embodiment of FIG. 6 may be similar or identical with the embodiments shown herein before. Moreover, the cross-sectional view vertical between I and I' taken along the first direction may be identical with the cross-sectional view shown in FIG. 4B.

Figure 7:
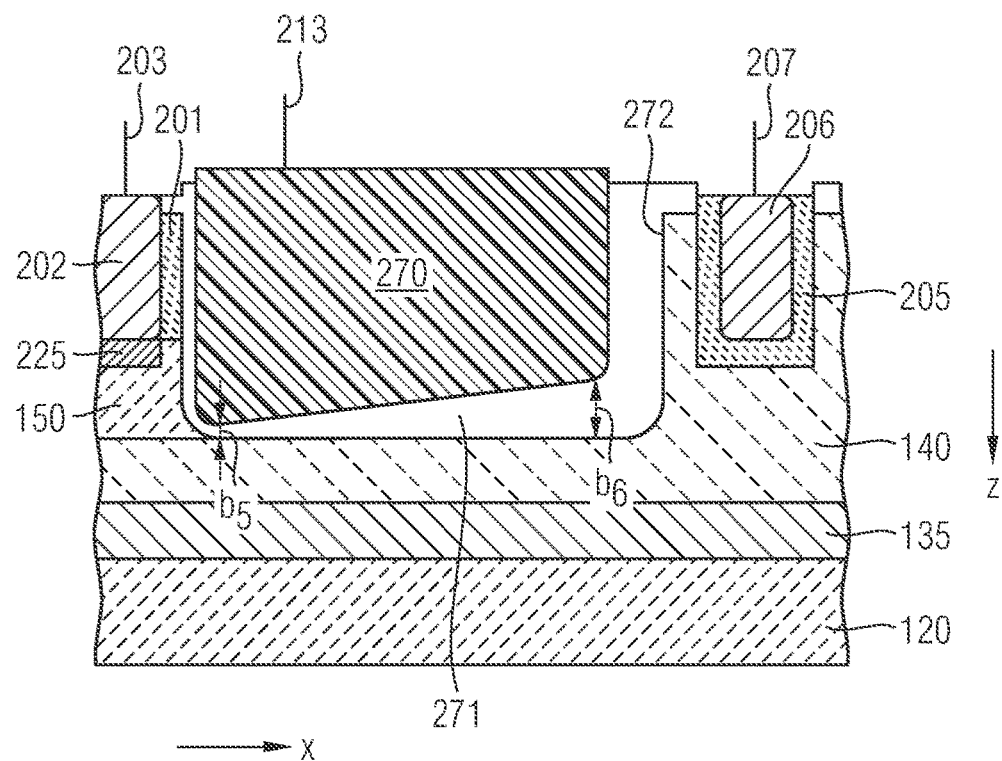
FIG. 7 shows a vertical cross-sectional view of a semiconductor device according to a further embodiment.

FIG. 7 shows a vertical cross-sectional view of a semiconductor device according to a further embodiment. The cross-sectional view of FIG. 7 is taken so as to intersect a trench 272 in which the gate electrode 210 and the field plate 250 are disposed. Many components of the semiconductor device of FIG. 7 are identical or similar to respective components of the embodiments described herein before. However, differing from the above-described embodiments, a thickness of the dielectric layer at a bottom side of the trench 272 increases along the first direction. The thickness may be measured along the depth direction of the substrate, e.g. the z direction. In more detail, the thickness at the bottom side increases along the extension of the drift zone 260. Alternatively, the thickness may increase from a portion adjacent to the body region 220 to a portion adjacent to the drain region 205. In particular, the thickness of the dielectric layer 271 may gradually increase. For example, the thickness of the insulating layer 271 may be constant within a portion adjacent to the body region 220. For example, the thickness of the dielectric layer 271 may increase from a thickness b5 that is measured at a portion adjacent to the source region 201 to a thickness b6 that is measured in a portion adjacent to the drain region 205. For example, a ratio of the thickness b6 to the thickness b5 may be larger than 2, e.g. larger than 2 and smaller than 100.

As is readily to be understood, various modifications of the described embodiments may be performed. Moreover, a doping concentration in the drift zone may vary according to all embodiments. In particular, the doping concentration may decrease from a portion adjacent to the body region to a portion adjacent to the drain region 205. For example, a horizontal cross-sectional view of the semiconductor device may be similar any of the cross-sectional views shown in FIGS. 1A, 3, 4A, 6, and 6. As a further alternative, the thickness of the dielectric layer 271 measured along the y direction may be constant.

In the following, processes for manufacturing such a semiconductor device will be explained in more detail. In particular, for manufacturing a semiconductor device as has been described herein, usual processing steps for defining the respectively doped portions etc. will be performed. Optionally, the gate electrode may have been formed e.g. in gate trenches 212. Alternatively, the gate electrode 210 and the field plate 250 may be arranged in a single trench. Further, trenches 252 for forming the field plate may be formed.

The upper portion of FIG. 8A shows a horizontal cross-sectional view of the substrate taken between II and II', whereas the lower portion of FIG. 8A shows a vertical cross-sectional view of the substrate taken between I and I'. Thereafter, a silicon nitride liner 713 may be formed over the resulting surface. Further, the silicon nitride liner 713 may be appropriately patterned, e.g. using a photolithographical process. As a result, an opening 701b may be formed in the silicon nitride liner 713. A portion of the silicon oxide layer 701 is uncovered at a portion of the opening 701b. Moreover, a portion of the silicon oxide layer 701 is covered by the silicon nitride liner 713 and is disposed adjacent to the opening 701b.

FIG. 8B shows a horizontal cross-sectional view and a vertical cross-sectional view of a resulting structure. As is shown, parts of the silicon oxide layer 701 are covered by the silicon nitride layer 713, whereas other parts of the silicon oxide layer 701 are not covered by the silicon nitride liner 713. Thereafter, a wet etching step is performed. For example, the substrate may be etched in a liquid etchant such as fluoric acid (HF). Due to this etching process, those parts which have been damaged by the Ar-ions will be easily etched. Moreover, since the ion implantation process has mainly damaged the surface portion of the oxide layer 701, the silicon oxide layer 701 will be etched in portions 701a and 701b which are exposed at one side thereof. In particular, a surface portion of the silicon oxide in region 701a will be etched so as to underetch the silicon nitride liner 713 in this portion. Moreover, the portions of the silicon oxide layer 701 which are entirely covered by the silicon nitride liner 713 will not be etched. As a result, a gradually increasing thickness of the layer 701 is achieved.

FIG. 8C shows examples of a resulting structure. As is shown in the upper portion of FIG. 8C, the thickness of the silicon oxide layer 701 gradually increases along the first direction, e.g. the x direction. In a similar manner, as is shown in the lower portion of FIG. 8C, the thickness of the silicon oxide layer 701 gradually increases. The angle of the tapering of the silicon oxide layer 701 may be determined by setting the implantation dose of the ion implantation step. In more detail, the higher the dose, the larger the angle measured along the silicon oxide material.

Thereafter, the silicon nitride liner 713 may be removed, e.g. by wet etching. Thereafter, a thin silicon oxide layer 715 may be formed on the bottom side and on the sidewalls of the trench 712. For example, a gate dielectric layer may be formed. According to an embodiment, the gate dielectric layer may be formed by thermal oxidation. Alternatively, if only the field plate 250 is to be disposed in the trench 712, the thin silicon oxide layer forms the field dielectric layer. Thereafter, a conductive material may be formed in the trench. For example, the conductive layer may form the field plate or, alternatively, the combined gate electrode and field plate. FIG. 8D shows an example of a resulting structure.

Thereafter, further processing steps for completing the transistor may be performed, e.g. various doping processes so as to dope the body region, the source and the drain region. Further, source and drain contact trenches may be formed and filled with a suitable contact material.

Figure 9:
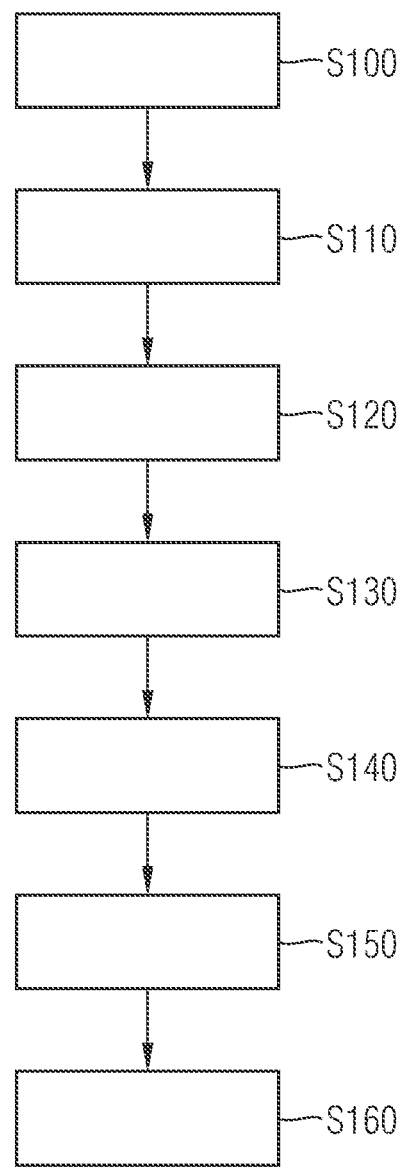
FIG. 9 shows a flow diagram of a method of manufacturing a semiconductor device according to an embodiment.

FIG. 9 summarizes a method of manufacturing a semiconductor device according to an embodiment. A method of manufacturing a semiconductor device comprising a transistor in a semiconductor body having a first main surface comprises forming a source region (S100), forming a drain region (S110), forming a body region (S120), forming a drift zone (S130), forming a gate electrode (S140) at the body region, the body region and the drift zone being formed along a first direction between the source region and the drain region, the first direction being parallel to the first main surface, the gate electrode being formed in gate trenches extending in the first direction, forming a field plate (S150) in field plate trenches extending along the first direction in the drift zone, and forming a field dielectric layer (S160) between the field plate and the drift zone, a thickness of the field dielectric layer gradually increasing along the first direction from a portion adjacent to the source region to a portion adjacent to the drain region. The various processes may be performed in a sequence as is appropriate for manufacturing the semiconductor device. Further, processes may be combined and may be performed as joint processes.

Moreover, FIG. 10 summarizes the method that has been explained with reference to FIG. 8A to 8D for forming a graded oxide layer. A method of manufacturing a semiconductor device comprises forming a trench in a semiconductor substrate (S200), forming an oxide layer (S210) over sidewalls and over a bottom side of the trench, performing an ion implantation process (S220), forming a cover layer and patterning the covering layer (S230), thereby forming an uncovered area and a covered area of the oxide layer, respectively, performing an isotropic etching process (S240) thereby removing portions of the uncovered area of the oxide layer and removing a part of a surface portion of the covered area adjacent to the uncovered portions, and removing (S250) remaining portions of the covering layer. This method may be used for generating an oxide layer at a sidewall of a trench, the oxide layer having a varying thickness. In particular, the oxide layer may have a gradually increasing thickness, e.g. a tapered thickness. In more detail, a tapered oxide layer may be formed at a portion of the covered area adjacent to the uncovered area. For example, the cover layer may be patterned to form an opening in the cover layer.

FIG. 8A shows an example of a field plate trench 712 formed in a semiconductor substrate 700. A silicon oxide layer 701 is formed so as to cover the sidewalls and a bottom of the trench 712. Then, a tilted ion implantation step 704 may be performed. For example, the ion implantation step may be performed using Ar-Ions. For example, an implantation dose may be 1e12 to 1e15/cm$^3$. Nevertheless, as is readily to be understood, ions of different materials may be used which may damage the silicon oxide layer resulting in an increased solubility in an etchant. The silicon oxide layer may be formed to a thickness of approximately 100-4000 nm. The tilted ion implantation process may be performed so as to dope the sidewalls extending along the first direction and the sidewalls extending along the second direction.

The method may further comprise filling a fill material into the trench (S260). For example, the fill material may be conductive. The method may further comprise forming an oxide layer (S270) over sidewalls and the bottom side of the trench before filling a fill material into the trench. According to an embodiment, the ion implantation process is performed as a tilted ion implantation process so as to implant the sidewalls of the trench. According to an embodiment, the method may further comprise forming a source region, forming a drain region, forming a body region, and forming a gate electrode (S280), to form components of a field effect transistor, wherein the conductive fill material in the trench forms a field plate of the transistor. The various processes may be performed in a sequence as is appropriate for manufacturing the semiconductor device. Further, processes may be combined and may be performed as joint processes.

While embodiments have been described above, it is obvious that further embodiments may be implemented. For example, further embodiments may comprise any subcombination of features recited in the claims or any subcombination of elements described in the examples given above, unless specifically noted otherwise. Accordingly, the spirit and scope of the appended claims should not be limited to the description of the embodiments contained herein.

What is claimed is:

1. A semiconductor device comprising:
   a transistor in a semiconductor body having a main surface, the transistor comprising:
      a source region;
      a drain region;
      a body region;
      a drift zone;
      a gate electrode at the body region, the body region and the drift zone being disposed along a first direction between the source region and the drain region, and the first direction being parallel to the main surface;
      a field plate disposed in field plate trenches having a longitudinal axis extending along the first direction in the drift zone; and
      a field dielectric layer between the field plate and the drift zone, a thickness of the field dielectric layer gradually increasing along the first direction from a portion adjacent to the source region to a portion adjacent to the drain region,
      wherein the thickness of the field dielectric layer is measured along a second direction parallel to the main surface, the second direction being perpendicular to the first direction, and
      wherein a second thickness of the field dielectric layer at a bottom of the gate trenches gradually increases along the first direction, the second thickness being measured along a third direction perpendicular to the main surface.

2. The semiconductor device according to claim 1, wherein the gate electrode is disposed in gate trenches extending in the first direction.

3. The semiconductor device according to claim 2, wherein the field plate trenches and the gate trenches are separated from each other, respectively.

4. The semiconductor device according to claim 2, wherein the field plate trenches are merged with the gate trenches.

5. The semiconductor device according to claim 2, wherein a first distance between adjacent gate trenches is smaller than a second distance between adjacent field plate trenches.

6. The semiconductor device according to claim 2, wherein a first distance between adjacent gate trenches is equal to a second distance between adjacent field plate trenches.

7. The semiconductor device according to claim 1, wherein a distance between adjacent field plate trenches decreases along the first direction from a side adjacent to the source region to a side adjacent to the drain region.

8. The semiconductor device according to claim 1, wherein a doping concentration of the drift zone decreases along the first direction from a side adjacent to the source region to a side adjacent to the drain region.

9. The semiconductor device according to claim 1, wherein a thickness of a gate dielectric layer between the gate electrode and the body region increases along the first direction from a side adjacent to the source region to a side adjacent to the drain region.

10. The semiconductor device according to claim 1, wherein the thickness of the field dielectric layer is measured along a third direction perpendicular to the main surface.

* * * * *